US011628406B2

(12) United States Patent
Cha et al.

(10) Patent No.: US 11,628,406 B2
(45) Date of Patent: Apr. 18, 2023

(54) FABRICATING CALCITE NANOFLUIDIC CHANNELS

(71) Applicant: Saudi Arabian Oil Company, Dhahran (SA)

(72) Inventors: Dong Kyu Cha, Abqaiq (SA); Mohammed Badri AlOtaibi, Abqaiq (SA); Sultan Muhammad Al Enezi, Dammam (SA); Ali Abdallah Al-Yousef, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 211 days.

(21) Appl. No.: 17/156,044

(22) Filed: Jan. 22, 2021

(65) Prior Publication Data

US 2021/0162352 A1 Jun. 3, 2021

Related U.S. Application Data

(62) Division of application No. 16/208,301, filed on Dec. 3, 2018, now Pat. No. 10,926,227.

(51) Int. Cl.
*B01D 67/00* (2006.01)
*B01D 71/02* (2006.01)
(Continued)

(52) U.S. Cl.
CPC ..... *B01D 67/0088* (2013.01); *B01D 67/0093* (2013.01); *B01D 71/025* (2013.01);
(Continued)

(58) Field of Classification Search
CPC ............ B01D 67/0088; B01D 67/0093; B01D 71/025; B01D 2323/28; B01D 2325/028;
(Continued)

(56) References Cited

U.S. PATENT DOCUMENTS 4,003,818 A * 1/1977 Juillard ................... C25B 13/08
264/49
4,564,997 A * 1/1986 Matsuo ............... H01L 21/7688
257/E21.546
(Continued)

FOREIGN PATENT DOCUMENTS

WO WO 2019032903 2/2019

OTHER PUBLICATIONS

Lee et al., "Site-Selective In Situ Grown Calcium Carbonate Micromodels with Tunable Geometry, Porosity and Wettability," Advanced Functional Materials, 26, Jul. 1, 2016, 10 pages.
(Continued)

*Primary Examiner* — David A Vanore
(74) *Attorney, Agent, or Firm* — Fish & Richardson P.C.

(57) ABSTRACT

A method for fabricating calcite channels in a nanofluidic device is described. A porous membrane is attached to a substrate. Calcite is deposited in porous openings in the porous membrane attached to the substrate. A width of openings in the deposited calcite is in a range from 50 to 100 nanometers (nm). The porous membrane is etched to remove the porous membrane from the substrate to form a fabricated calcite channel structure. Each channel has a width in the range from 50 to 100 nm.

10 Claims, 3 Drawing Sheets

(51) Int. Cl.
 B81C 1/00 (2006.01)
 B01L 3/00 (2006.01)
 H01J 37/20 (2006.01)
(52) U.S. Cl.
 CPC ........ *B01L 3/5027* (2013.01); *B81C 1/00071* (2013.01); *B81C 1/00158* (2013.01); *H01J 37/20* (2013.01); *B01D 2323/28* (2013.01); *B01D 2325/028* (2013.01); *B81C 2201/0115* (2013.01); *B81C 2201/0143* (2013.01); *B81C 2201/0176* (2013.01); *H01J 2237/20* (2013.01)
(58) Field of Classification Search
 CPC ........... B01L 3/5027; B01L 2300/0896; B01L 3/502707; B81C 1/00071; B81C 1/00158; B81C 2201/0115; B81C 2201/0143; B81C 2201/0176; B81C 1/00119; H01J 37/20; H01J 2237/20; C25D 11/045; G01N 15/082
 See application file for complete search history.

(56) References Cited

U.S. PATENT DOCUMENTS

| | | | | |
|---|---|---|---|---|
| 9,293,750 | B2* | 3/2016 | Yang | B01D 67/0046 |
| 10,926,227 | B2* | 2/2021 | Cha | B01L 3/502707 |
| 11,366,391 | B2* | 6/2022 | Cha | G03F 7/2059 |
| 2004/0146803 | A1* | 7/2004 | Kohl | B81C 1/00476 |
| | | | | 430/326 |
| 2008/0246052 | A1* | 10/2008 | Hsu | H01L 23/3735 |
| | | | | 257/99 |
| 2009/0104564 | A1* | 4/2009 | Yang | H01L 21/0337 |
| | | | | 430/312 |
| 2010/0330721 | A1* | 12/2010 | Barlocchi | B81C 1/00047 |
| | | | | 438/49 |
| 2011/0123771 | A1* | 5/2011 | Stavis | B82Y 30/00 |
| | | | | 428/156 |
| 2012/0267603 | A1* | 10/2012 | Lee | H01L 29/127 |
| | | | | 257/E29.069 |
| 2013/0316329 | A1* | 11/2013 | Yu | G01N 29/02 |
| | | | | 427/100 |
| 2014/0363623 | A1* | 12/2014 | Sun | B32B 7/12 |
| | | | | 428/209 |
| 2016/0363600 | A1* | 12/2016 | Sniadecki | B01L 3/502715 |
| 2017/0067836 | A1* | 3/2017 | Hull | G01N 23/02 |
| 2017/0114242 | A1* | 4/2017 | Lloyd | C09D 127/22 |
| 2019/0070566 | A1* | 3/2019 | Kidambi | B01D 61/243 |

OTHER PUBLICATIONS

Lu et al., "Fabrication of Nanostructure by Template Method in Microfluidics," Chinese Journal of Analytical Chemistry, 37(6), Jun. 1, 2009, 6 pages.

Song et al., "Chip-off-the-rock: the study of reservoir-relevant geological processes with real-rock micromodels," Royal Society of Chemistiy, 2014, 14:4382-4390, 9 pages.

EPO Communication Pursuant to Article 94(3) in European Appln. No. 19824162.2, dated Jan. 26, 2023, 4 pages.

* cited by examiner

FABRICATING CALCITE NANOFLUIDIC CHANNELS

CROSS-REFERENCE TO RELATED APPLICATIONS

This application is a divisional of and claims the benefit of U.S. application Ser. No. 16/208,301, filed on Dec. 3, 2018, the entire contents of which are incorporated by reference in its entirety.

TECHNICAL FIELD

This specification relates to nanofluidics and more specifically for petrophysical applications.

BACKGROUND

Enhanced oil recovery methods are utilized to increase the amount of crude oil that can be extracted from an oil field. At small scales (channel sizes on the order of nanometers or micrometers), fluids can behave differently in that factors such as surface tension begin to dominate the system. With better understanding of fluid behavior at small scales, enhanced oil recovery methods can be improved to extract more oil from a source rock or reservoir. Microfluidic models which can replicate conditions found in underground reservoirs have been developed to observe, evaluate, and understand physical and chemical phenomena in oil extraction and recovery.

A portion of the world's oil reserves exists in carbonate rocks, such as limestone and dolostone. These rocks, however, can vary considerably in characteristics such as texture, porosity, and permeability, even across areas within a same formation. This variation can create a challenge in achieving a consistent flow of oil. Techniques associated with microfluidics can be used to characterize crude oil interactions with different fluids and with rock formations in petrophysics applications. For example, conventional calcite ($CaCO_3$) channel models can include etched natural calcite crystal, but these models are typically on the scale of micrometers. Fluidics at a nanoscale (that is, on the order of nanometers) can be beneficial in understanding the physical and chemical phenomena of fluid/fluid and fluid/calcite rock interactions at an atomic scale.

Microfluidics and nanofluidics are considered as an important method to characterize brine and crude oil interactions in petro physics application. For understanding the physical and chemical phenomena of fluid/fluid and fluid/calcite rock interactions at an atomic scale, a nanosize calcite cylindrical channel in a nanofluidic chip can be required. This can be the case for atomic scale analysis that uses transmission electron microscopy (TEM) or scanning electron microscopy (SEM). For understanding the physical and chemical phenomena of fluid/fluid and fluid/calcite rock interactions at atomic scale, nanosize calcite cylindrical channel can be used in nanofluidic chip. Nanoscale analysis can be performed using electron microscopy (EM). However, conventional calcite channels in micro-fluidic chips are fabricated with etched natural calcite crystal and their size is at a micron scale.

SUMMARY

The present disclosure describes a method of fabricating calcite channels for nanofluidics. Certain aspects of the subject matter described here can be implemented as a method. A porous is membrane attached to a substrate. Calcite is deposited in porous openings in the porous membrane that is attached to the substrate. A width of openings in the deposited calcite is in a range from 50 to 100 nanometers (nm). The porous membrane is etched to remove the porous membrane from the substrate to form a fabricated calcite channel structure. Each channel has a width in the range from 50 to 100 nm.

Conventional methods for fabricating channels in microfluidic chips can generally include methods that use glass or silicon etching, photolithography, and polymerization. However, when these techniques are used, it can be difficult to fabricate nanosize cylindrical channels due to resolution issues and challenges that can typically result from the use of these fabrication methods. Fabrication of calcite channels can be more challenging because the fabrication can include etching of natural calcite crystal or thin film-based channels. Techniques described in the present disclosure can be used to observe and study the physical and chemical phenomena at interface between calcite and brine or crude oil with high resolution electron microscopy such as SEM and transition electron microscopy (TEM). The techniques can include a process for fabricating nanoscale cylindrical calcite channels. The nanoscale cylindrical calcite channels can mimic real nano porous structures in reservoir rock.

Advantages of methods and systems described in the present disclosure can include the following. Techniques that use fabricated nanosize calcite patterns can be faster and more efficiently compared with electron beam lithography techniques. The techniques can allow characterization of fluid/fluid or fluid/calcite interactions using scanning electron microscopy (SEM). This can provide a better understanding of the interactions between fluid and calcite rock at their interfaces and in porous structures. Use of the techniques can provide better understanding of the interactions between fluid/rock and fluid/fluid at higher resolutions using an advanced electron microscopy. The techniques can provide favorable effects for applying digital rock physics applications. The techniques can help in improving and optimizing enhanced oil recovery processes in the field.

The details of one or more implementations of the subject matter of this specification are set forth in the accompanying drawings and the description. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

The following detailed description describes a method of fabricating calcite channels for nanofluidics, and is presented to enable any person skilled in the art to make and use the disclosed subject matter in the context of one or more particular implementations. Specifically, the disclosed subject matter describes techniques for the fabrication of calcite nanofluidic channels by using combination of atomic layer deposition (ALD) and a porous membrane template for in-situ characterization in scanning electron microscopy (SEM). Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

In some implementations, techniques can be used to fabricate nanoscale calcite channels for nanofluidic chips. The fabricated nanofluidic chips can be used to help understand physical and chemical interactions between fluid and calcite ($CaCO_3$) with high resolution (for example, at nanoscale). The techniques can also be used to simulate and observe conditions and interactions of actual mineralogy of carbonate rock (for example, $CaCO_3$).

Figure 1:
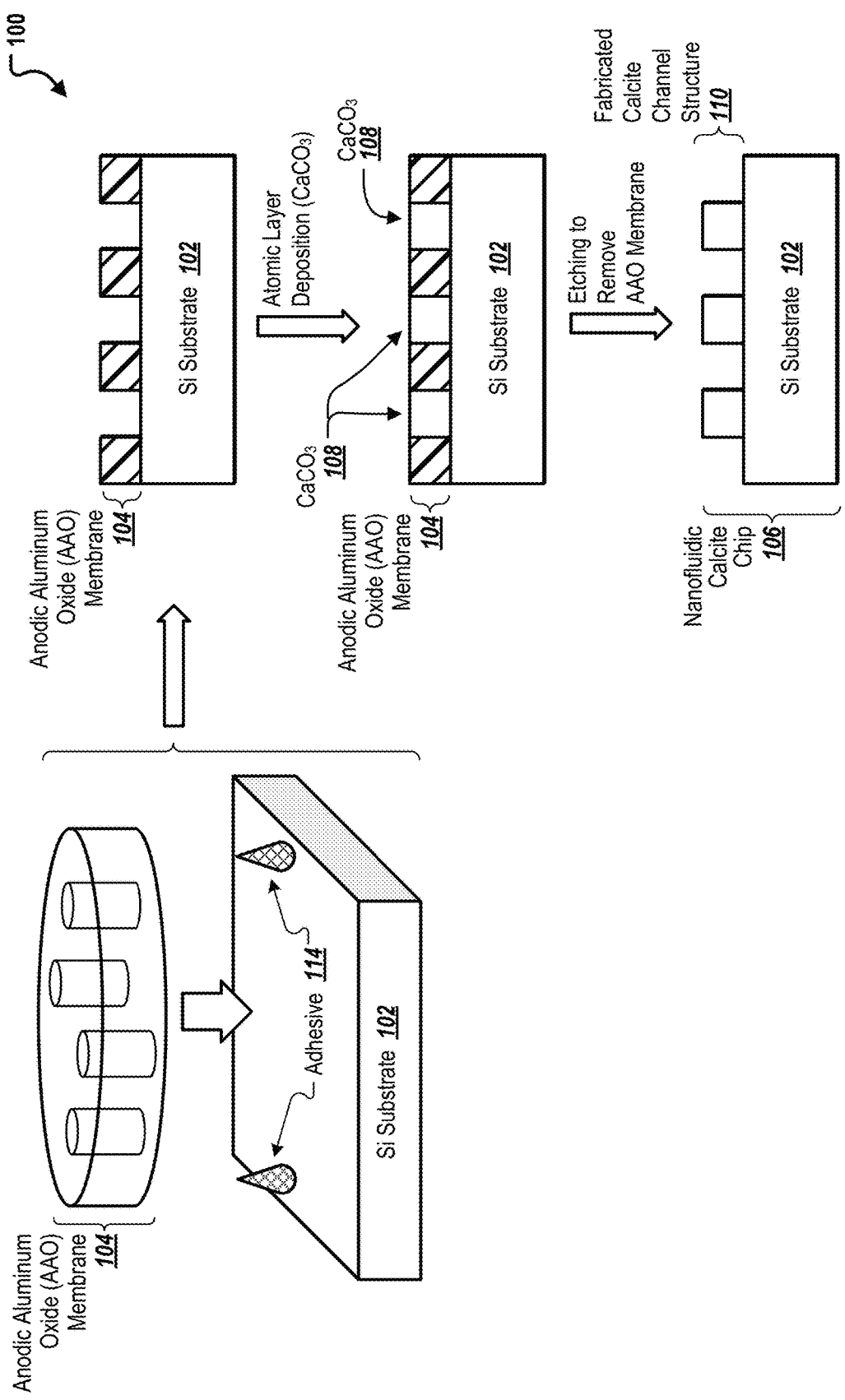
FIG. 1 is a schematic diagram illustrating examples of components of a procedure for fabrication of a nanofluidic calcite chip, according to some implementations of the present disclosure.

FIG. 1 is a schematic diagram illustrating examples of components of a procedure 100 for fabrication of a nanofluidic calcite chip, according to some implementations of the present disclosure. The procedure 100 can be based on the use of a combination membrane as a template and ALD techniques. In some implementations, the techniques can include steps such as the following.

A silicon (Si) substrate 102 can be prepared that is to serve as the bottom of the nanofluidic calcite chip 106. The size of the Si substrate 102 can depend on a size of an anodic aluminum oxide (AAO) membrane 104 that will serve as a porous membrane for deposition. For example, the Si substrate 102 can be slightly larger than the AAO membrane 104. The Si substrate 102 can typically be smaller than an SEM holder, for example, smaller than 3 millimeters (mm) in diameter.

The AAO membrane 104 can be attached (for example, placed onto) Si substrate 102 with an adhesive 114, such as a cyanoacrylate adhesive. The adhesive 114 can serve to secure edges of the AAO membrane 104 to the Si substrate 102, as shown in FIG. 1.

After the AAO membrane 104 is attached to the Si substrate 102, porous openings in the AAO membrane 104 can be filled with calcite 108 using ALD techniques. The calcite 108 can be CaCO3, for example. The size or diameter of the porous openings in the AAO membrane 104 can determine the size of calcite channels that will be created, typically in a range of 50 to 100 nanometers (nm) in diameter. Atomic layer deposition is a technique for depositing a material from a vapor phase and includes a sequence of alternating introductions of gaseous chemical precursors that react with the substrate. The individual gas-surface reactions are called half-reactions. During each half-reaction, a precursor gas can be introduced for a designated amount of time. This allows the precursor gas to fully react with the device surface and deposit a single layer at the surface. The device is then purged with an inert gas, such as nitrogen or argon, to remove unreacted precursor, reaction by-products, or both. The next precursor gas is then introduced to deposit another layer and then is similarly purged. The process cycles as alternating precursor gas is deposited layer by layer until the desired height is reached. In certain implementations, the atomic layer deposition process can continue until the calcite layers reach a similar or same height as the original coating of photoresist. The deposited calcite can have at least one side with a length in a range of approximately 50 to 100 nm.

After ALD techniques have been used to fill the porous openings in the AAO membrane 104 with calcite, the AAO membrane 104 can be etched using chloroform. The etching can be used to remove the AAO membrane 104, leaving only a fabricated calcite channel structure 110, and creating the nanofluidic calcite chip 106. Other materials that can be used for etching can include, for example, sodium hydroxide (NaOH), hydrofluoric acid (a solution of hydrogen fluoride (HF)), or orthophosphoric (or phosphoric) acid ($H_3PO_4$).

Figure 2:
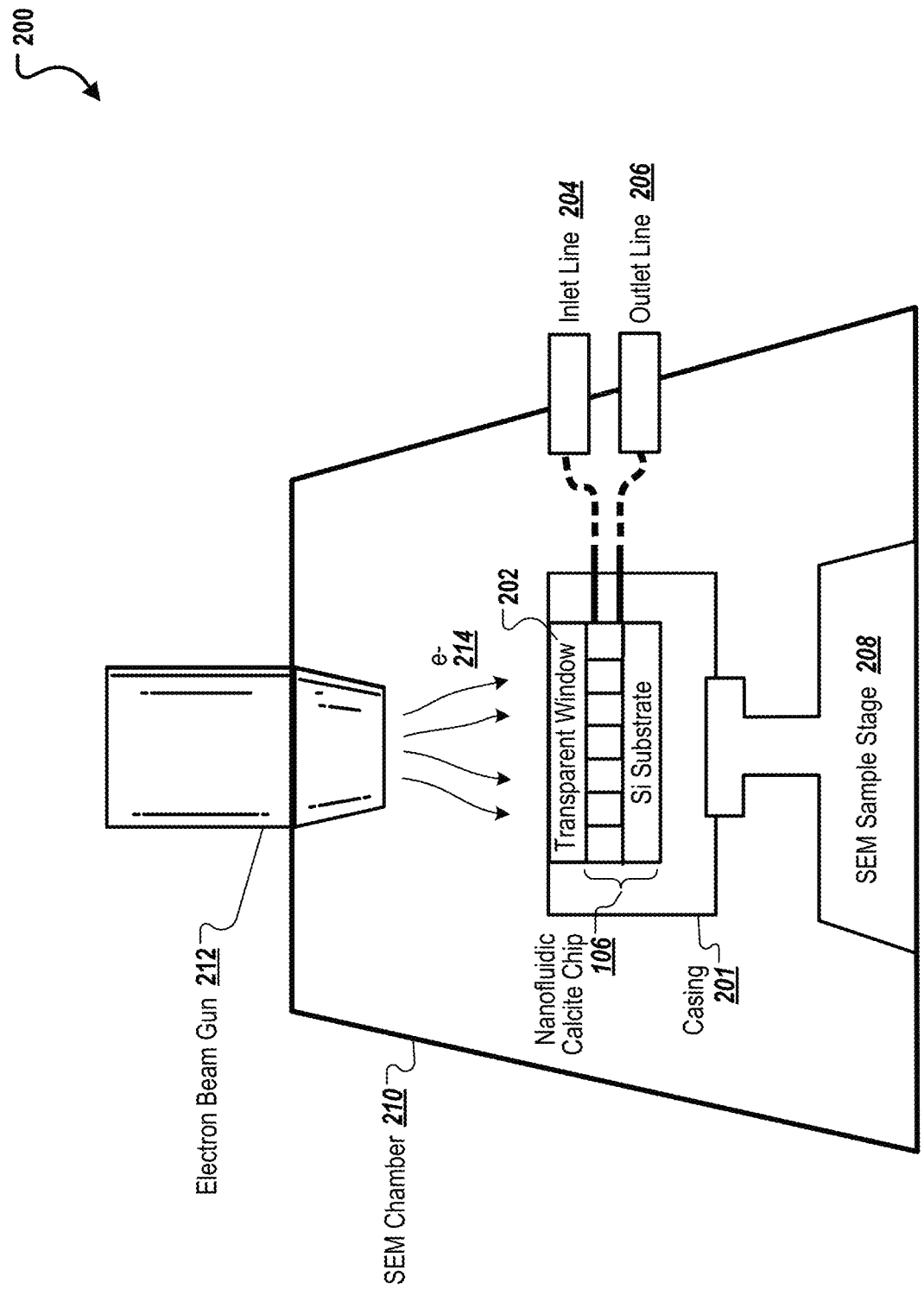
FIG. 2 is a schematic diagram of an example of the nanofluidic calcite chip in a scanning electron microscopy (SEM) system, according to some implementations of the present disclosure.

FIG. 2 is a schematic diagram of an example of the nanofluidic calcite chip 106 in a SEM system 200, according to some implementations of the present disclosure. The nanofluidic calcite chip 106 can be packaged, for example, within a casing 201 (for example, a metal case) that includes a transparent window 202 (for example, optically transparent). The packaging can also include inlet and outlet connections, for example, at least one inlet line 204 and an outlet line 206. The packaging can result in a completed nanofluidic device that can be mounted on the SEM sample stage 208 that that is used in an SEM chamber 210 that is part of the SEM system 200. In some implementations, the casing 201 can be made of a conductive metal, and the window 202 can be made of an electrically conductive material that is also optically transparent, such as silicon nitride (SiN). Electrical conductivity can allow the window 202 to avoid accumulating an electric charge, and the transparency of the window 202 allows observation.

The inlet line 204 can be used to inject a fluid through the nanofluidic calcite chip 106, such as inside the SEM chamber 210. For example, the inlet line 204 can be used to introduce a brine solution to the nanofluidic calcite chip 106. The outlet line 206 can allow the fluid to exit. The inlet line 204 and outlet line 206 can be located on the same side or opposite sides of the nanofluidic calcite chip 106. The fluid can pass through the nanofluidic calcite chip 106 while an electron beam gun 212 emits electrons (e–) 214 in order to produce images. For example, the nanofluidic calcite chip 106 can be imaged using the SEM.

Use of the nanofluidic calcite chip 106 in the SEM chamber 210 can make it possible to observe fluid/rock interactions at a nanoscale level or an atomic scale level. Also, fabricated nanoscale calcite channels can provide information that is useful in understanding fluid/calcite interactions inside porous structures. The information can be used in understanding physical and chemical interactions between fluid and calcite at greater resolutions (for example, approaching atomic scale) and to assist in optimizing oil recovery processes in the field.

Figure 3:
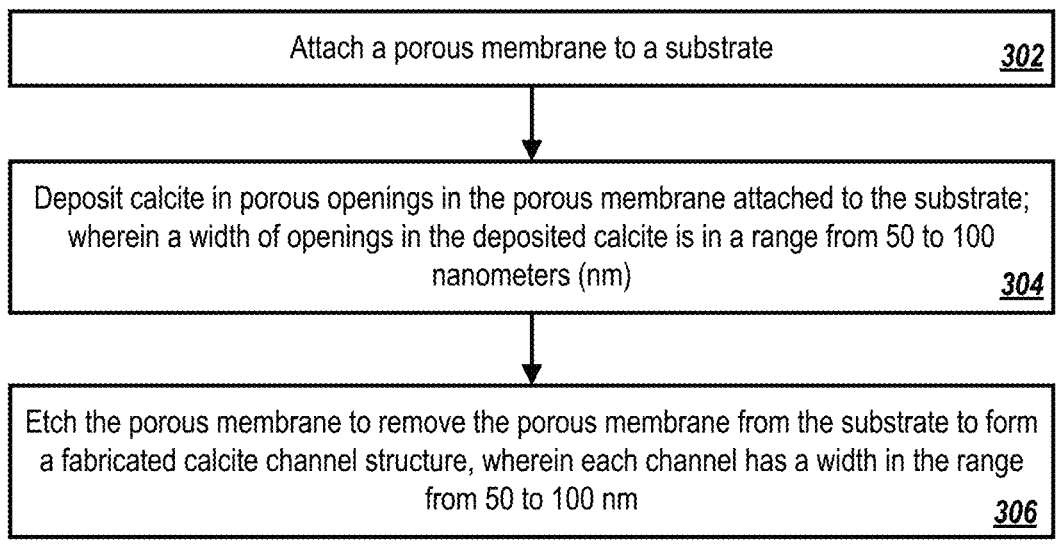
FIG. 3 is a flowchart illustrating an example method for fabricating the nanofluidic calcite chip, according to some implementations of the present disclosure.

FIG. 3 is a flowchart illustrating an example method 300 for fabricating the nanofluidic calcite chip 106, according to some implementations of the present disclosure. The size and shape of the nanofluidic calcite chip 106 can be determined, for example, to be a size that works with a size of the SEM sample stage 208.

At 302, a porous membrane is attached to a substrate. For example, referring to FIG. 1, the substrate can be can be the Si substrate 102, and the porous membrane can be the AAO membrane 104. In some implementations, the thickness of the substrate can be equal to a desired height of calcite channels in a nanofluidic device. Attaching the AAO membrane 104 to the Si substrate 102 can be accomplished using the adhesive 114 (for example, a cyanoacrylate adhesive) that is used to bond edges of the AAO membrane 104 to the Si substrate 102.

At 304, calcite is deposited in porous openings in the porous membrane attached to the substrate. As an example, porous openings in the AAO membrane 104 can be filled with calcite 108 using ALD techniques. A width of openings in the deposited calcite can be in a range of 50 to 100 nm, for example.

At 306, the porous membrane is etched to remove the porous membrane from the substrate to form a fabricated calcite channel structure, where each channel has a width in the range from 50 to 100 nm. For example, the nanofluidic calcite chip 106, including the fabricated calcite channel structure 110, can be created by etching the AAO membrane 104. The etching can remove the AAO membrane 104 from the substrate 102, leaving the deposited calcite on the Si substrate 102. A width of channels in the fabricated calcite channel structure 110 can be, for example, 50 to 100 nm.

Described implementations of the subject matter can include one or more features, alone or in combination.

For example, in a first implementation, a method includes the following steps. A porous membrane is attached to a substrate. Calcite is deposited in porous openings in the porous membrane attached to the substrate. A width of openings in the deposited calcite is in a range from 50 to 100 nanometers (nm). The porous membrane is etched to remove the porous membrane from the substrate to form a fabricated calcite channel structure. Each channel has a width in the range from 50 to 100 nm.

The foregoing and other described implementations can each, optionally, include one or more of the following features.

A first feature, combinable with any of the following features, where the porous membrane is an anodic aluminum oxide (AAO) membrane.

A second feature, combinable with any of the previous or following features, where attaching the porous membrane to the substrate includes using an adhesive to attach edges of the porous membrane to the substrate.

A third feature, combinable with any of the previous or following features, where depositing the calcite in the porous openings in the porous membrane included using atomic layer deposition (ALD) techniques for depositing the calcite.

A fourth feature, combinable with any of the previous or following features, where etching the porous membrane to remove the porous membrane from the substrate includes using chloroform, sodium hydroxide (NaOH), hydrofluoric acid, or phosphoric acid ($H_3PO_4$).

A fifth feature, combinable with any of the previous or following features, further comprising injecting, inside a scanning electron microscope (SEM) chamber, a fluid through the nanofluidic calcite chip, and imaging the nanofluidic calcite chip using the SEM.

A sixth feature, combinable with any of the previous or following features, where passing a fluid through the nanofluidic calcite chip includes using an inlet line and an outlet line.

A seventh feature, combinable with any of the previous or following features, where the substrate is a silicon (Si) substrate.

An eighth feature, combinable with any of the previous or following features, further comprising adding a transparent window to the nanofluidic calcite chip.

A ninth feature, combinable with any of the previous or following features, further comprising casing the transparent window and the nanofluidic calcite chip in a casing.

In a second implementation, a system includes the following. A nanofluidic calcite chip includes a substrate and a fabricated calcite channel structure. The fabricated calcite channel structure is created by etching a porous membrane attached to the substrate to remove the porous membrane from the substrate. The etching leaves, as remaining to form the fabricated calcite channel structure, calcite previously deposited in the porous membrane. A width of openings in the calcite is in a range from 50 to 100 nanometers (nm). An SEM chamber includes an SEM sample stage for holding the nanofluidic calcite chip. An electron beam gun is configured to emit electrons through the nanofluidic calcite chip to produce images while a fluid is being passed through the nanofluidic calcite chip.

The foregoing and other described implementations can each, optionally, include one or more of the following features:

A first feature, combinable with any of the previous or following features, where the substrate comprises silicon.

A second feature, combinable with any of the previous or following features, further comprising a casing that encases the nanofluidic calcite chip.

A third feature, combinable with any of the previous or following features, where the casing further encases a window, attached to the nanofluidic calcite chip, through which the electrons pass before passing through the nanofluidic calcite chip.

A fourth feature, combinable with any of the previous or following features, where the window comprises an electrically conductive and optically transparent material.

A fifth feature, combinable with any of the previous or following features, where in the electrically conductive and optically transparent material comprises silicon nitride (SiN).

A sixth feature, combinable with any of the previous or following features, further comprising an inlet line and an outlet line for passing the fluid through the nanofluidic calcite chip.

A seventh feature, combinable with any of the previous or following features, where the porous membrane is an AAO membrane.

An eighth feature, combinable with any of the previous or following features, where the porous membrane is attached, using an adhesive, to edges of the substrate.

A ninth feature, combinable with any of the previous or following features, where the calcite deposited in the porous openings in the porous membrane is deposited using ALD techniques.

While this specification contains many specific implementation details, these should not be construed as limitations on the scope of any implementation or on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

What is claimed is:

1. A system comprising:
a nanofluidic calcite chip that includes a substrate and a fabricated calcite channel structure, wherein the fabricated calcite channel structure is created by etching a porous membrane attached to the substrate to remove the porous membrane from the substrate, wherein the etching leaves, as remaining to form the fabricated calcite channel structure, calcite previously deposited in the porous membrane, and wherein a width of openings in the calcite is in a range from 50 to 100 nanometers (nm); and
an SEM chamber including an SEM sample stage for holding the nanofluidic calcite chip; and;
an electron beam gun configured to emit electrons through the nanofluidic calcite chip to produce images while a fluid is being passed through the nanofluidic calcite chip.

2. The system of claim 1, wherein the substrate comprises silicon.

3. The system of claim 1, further comprising a casing that encases the nanofluidic calcite chip.

4. The system of claim 3, wherein the casing further encases a window, attached to the nanofluidic calcite chip, through which the electrons pass before passing through the nanofluidic calcite chip.

5. The system of claim 4, wherein the window comprises an electrically conductive and optically transparent material.

6. The system of claim 5, wherein in the electrically conductive and optically transparent material comprises silicon nitride (SiN).

7. The system of claim 1, further comprising an inlet line and an outlet line for passing the fluid through the nanofluidic calcite chip.

8. The system of claim 1, wherein the porous membrane is an AAO membrane.

9. The system of claim 1, wherein the porous membrane is attached, using an adhesive, to edges of the substrate.

10. The system of claim 1, wherein the calcite deposited in the porous openings in the porous membrane is deposited using ALD techniques.

* * * * *